US011084032B2

(12) United States Patent
Liu et al.

(10) Patent No.: US 11,084,032 B2
(45) Date of Patent: Aug. 10, 2021

(54) METHOD TO CREATE MULTILAYER MICROFLUIDIC CHIPS USING SPIN-ON CARBON AS GAP FILL AND SPIN-ON GLASS TONE INVERSION

(71) Applicant: International Business Machines Corporation, Armonk, NY (US)

(72) Inventors: Chi-Chun Liu, Altamont, NY (US); Yann Mignot, Slingerlands, NY (US); Joshua T. Smith, Croton on Hudson, NY (US); Bassem M. Hamieh, Albany, NY (US); Nelson Felix, Slingerlands, NY (US); Robert L. Bruce, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 257 days.

(21) Appl. No.: 16/419,707

(22) Filed: May 22, 2019

(65) Prior Publication Data
US 2020/0070151 A1    Mar. 5, 2020

Related U.S. Application Data

(60) Provisional application No. 62/723,687, filed on Aug. 28, 2018.

(51) Int. Cl.
*B01L 3/00* (2006.01)
*B81C 1/00* (2006.01)

(52) U.S. Cl.
CPC .... *B01L 3/502707* (2013.01); *B81C 1/00071* (2013.01); *B01L 2200/12* (2013.01);
(Continued)

(58) Field of Classification Search
CPC .......... B01L 3/502707; B01L 2200/12; B01L 2300/0887; B01L 2400/0415;
(Continued)

(56) References Cited

U.S. PATENT DOCUMENTS 6,321,791 B1    11/2001    Chow
6,592,696 B1    7/2003    Burdon et al.
(Continued)

FOREIGN PATENT DOCUMENTS

WO    WO-0042233 A1 *    7/2000    ....... G01N 27/44791
WO    2005084191 A2    9/2005

OTHER PUBLICATIONS

Dominik, J., et al., "Cold Chemical Lamination—New Bonding Technique of LTCC Green Tapes", Int. J. Appl. Ceram. Technol., Jun. 18, 2013, pp. 814-820, 7 [6].
(Continued)

*Primary Examiner* — Jennifer Wecker
*Assistant Examiner* — Kathryn Elizabeth Limbaugh
(74) *Attorney, Agent, or Firm* — Scully, Scott, Murphy & Presser, P.C.; Daniel P. Morris, Esq.

(57) ABSTRACT

A microfluidic chip with a high volumetric flow rate is provided that includes at least two vertically stacked microfluidic channel layers, each microfluidic channel layer including an array of spaced apart pillars. Each microfluidic channel layer is interconnected by an inlet/outlet opening that extends through the microfluidic chip. The microfluidic chip is created without wafer to wafer bonding thus circumventing the cost and yield issues associated with microfluidic chips that are created by wafer bonding.

19 Claims, 6 Drawing Sheets

Figure 1:
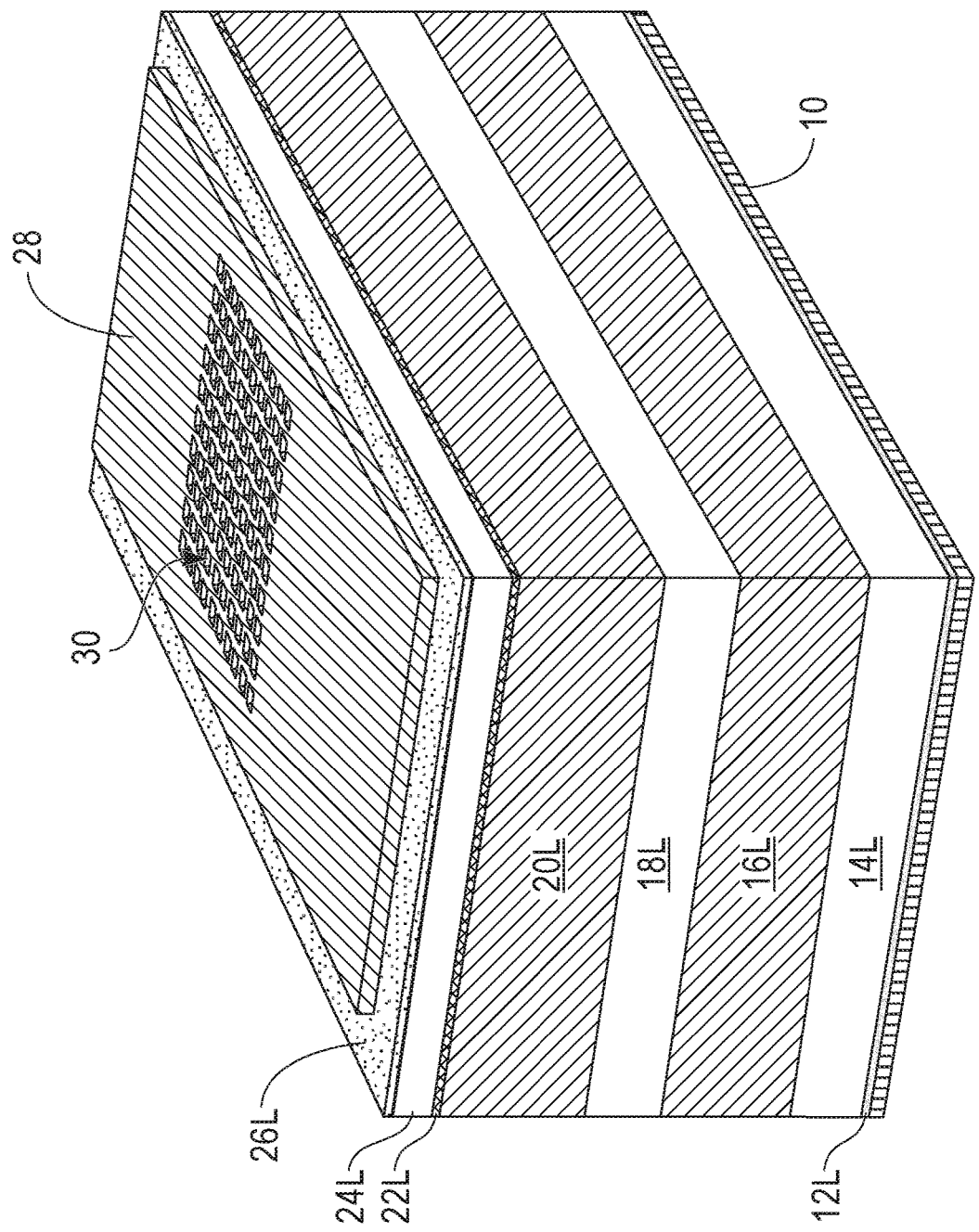

(52) U.S. Cl.
CPC .............. *B01L 2300/0887* (2013.01); *B01L 2400/0415* (2013.01); *B81C 2201/0109* (2013.01); *B81C 2201/0157* (2013.01)

(58) Field of Classification Search
CPC .... B81C 2201/0109; B81C 2201/0157; B81C 1/00071
See application file for complete search history.

(56) References Cited

U.S. PATENT DOCUMENTS

| | | | |
|---|---|---|---|
| 6,645,432 | B1 | 11/2003 | Anderson et al. |
| 7,033,910 | B2 | 4/2006 | Faris |
| 7,799,251 | B2 | 9/2010 | Therriault et al. |
| 8,865,599 | B2 | 10/2014 | Bai et al. |
| 9,102,129 | B2 | 8/2015 | Krishnamurthy et al. |
| 9,636,675 | B2 | 5/2017 | Astier et al. |
| 2009/0035590 | A1 | 2/2009 | Sullivan et al. |
| 2016/0144405 | A1 | 5/2016 | Astier et al. |
| 2016/0372326 | A1 | 12/2016 | Zhong et al. |
| 2017/0136460 | A1 | 5/2017 | Smith et al. |
| 2017/0144149 | A1 | 5/2017 | Smith et al. |

OTHER PUBLICATIONS

Wunsch, B. H., et al., "Nanoscale lateral displacement arrays for the separation of exosomes and colloids down to 20 nm", Nature Nanotechnology, Nov. 2016, pp. 936-942, vol. 11.

Kudo, T., et al., "Development of Spin-On-Carbon Hard Mask for Advanced Node", Proc. SPIE 9051, Mar. 27, 2014 Advances in Patterning Materials and Processes XXXI, 9 pages, San Jose, CA.

Chua, C. L., et al., "Out-of-Plane High-Q Inductors on Low-Resistance Silicon", Journal of Microelectromechanical Systems, Dec. 2003, pp. 989-995, vol. 12, No. 6.

Yun, H., et al., "Study on Planarization Performance of Spin on Hardmask", 2018 China Semiconductor Technology International Conference (CSTIC), May 31, 2018, pp. 3.

Jiang, B., et al., "Fine structuration of low-temperature co-fired ceramic (LTCC) microreactors", Lab on a Chip, Jan. 2013, pp. 1-100, vol. 1, No. 1.

\* cited by examiner

METHOD TO CREATE MULTILAYER MICROFLUIDIC CHIPS USING SPIN-ON CARBON AS GAP FILL AND SPIN-ON GLASS TONE INVERSION

CROSS REFERENCE TO RELATED APPLICATION

The present application claims the benefit of U.S. Provisional Patent Application No. 62/723,687 filed on Aug. 28, 2018, the entire content and disclosure of which is incorporated herein by reference.

BACKGROUND

The present application relates to a microfluidic chip/device. More particularly, the present application relates to a method of creating a microfluidic chip/device that contains multilayer microfluidic channels stacked one atop the other.

Deterministic lateral displacement (DLD) pillar arrays are an efficient technology to sort, separate and enrich micrometre-scale particles, which include parasites, bacteria, blood cells and circulating tumour cells in blood. However, this technology has not been translated to the true nanoscale, where it could function on biocolloids, such as exosomes. Exosomes, a key target of 'liquid biopsies', are secreted by cells and contain nucleic acid and protein information about their originating tissue. One challenge in the study of exosome biology is to sort exosomes by size and surface markers.

Recently, manufacturable silicon processes have been employed to produce microfluidic chips/devices containing nanoscale DLD (i.e., nano-DLD) pillar arrays of uniform gap sizes ranging from 25 nm to 235 nm. In such processes, wafer bonding is typically required to seal the microfluidic chips/devices. In wafer bonding formation of microfluidic chips/devices, a potential yield lost may be exhibited from leakage due to insufficient bonding, and/or pillar damage during the bonding process. Also, such bonding processes may have a higher manufacturing cost due to the need of using an extra glass or semiconductor wafer.

In addition to the above, conventional microfluidic chips/devices have a limited volumetric flow rate. For a given chip/array size, higher flow rate can be achieved by providing taller pillars within a given pillar array. However, the height of the pillar array is limited by the patterning capability (i.e., tall pillars can collapse due to aspect ratio and etch profile control). Moreover, microfluidic chips/devices composed of multilayer microfluidic channels using the prior art bonding processes have a high cost, and yield problem as mentioned above.

There is thus a need for providing a method that is capable of creating microfluidic chips/devices (hereinafter just microfluidic chips) that contain multilayer microfluidic channels which avoids the drawbacks that are associated with microfluidic chips/devices that are formed by wafer bonding.

SUMMARY

A microfluidic chip having a high volumetric flow rate is provided that includes at least two vertically stacked microfluidic channel layers, each microfluidic channel layer including an array of spaced apart pillars. Each microfluidic channel layer is interconnected by an inlet/outlet opening that extends through the microfluidic chip. The microfluidic chip is created without wafer to wafer bonding thus circumventing the cost and yield issues associated with microfluidic chips that are created by wafer bonding. In the present application, a multilayered material stack is formed in which a layer of a sacrificial material such as, for example, spin-on carbon is present beneath each layer of a microfluidic channel separating material. Each layer of microfluidic channel separating material may be composed of an inorganic material, polycrystalline silicon or amorphous silicon. After defining an array of pillars within the multilayered stack and thereafter inlet/outlet openings, the sacrificial material is removed. In the present application, only two lithographic steps (one for inversed-pillar formation and the other for inlet/outlet opening formation) are employed regardless of the number of layers within the multilayered material stack.

In one aspect of the present application, a method of forming a microfluidic chip containing multilayer microfluidic channels based on pillar arrays is provided. In one embodiment, the method includes forming a multilayered material stack including alternating layers of a sacrificial material and a microfluidic channel separating material. An array of hole shaped openings is then created in the multilayered material stack by utilizing a first lithography and etching step. Each hole shaped opening is then filled with an oxide material to provide an array of oxide pillars. Inlet/outlet openings are then defined in the multilayered material stack by utilizing a second lithography and etching step. Next, each layer of the sacrificial material is removed to provide a microfluidic channel layer (or region) containing spaced apart oxide pillars located beneath each layer of microfluidic channel separating material.

In another aspect of the present application, a microfluidic chip is provided, In one embodiment, the microfluidic chip includes at least two vertically stacked microfluidic channel layers (or regions), wherein a layer of a microfluidic channel separating material is located between each vertically stacked microfluidic channel layer (or region). An array of pillars is present in each vertically stacked microfluidic channel layer and passes though each layer of the microfluidic channel separating material. An inlet/outlet opening extends through the microfluidic chip and interconnects each microfluidic channel layer.

BRIEF DESCRIPTION THE DRAWINGS

FIG. 1 is a three-dimensional (3D) representation of a multilayered material stack of a substrate, a pad dielectric material layer, a first spin-on carbon fill material layer, a first inorganic dielectric material layer, a second spin-on carbon fill material layer, a second inorganic dielectric material layer, a hard mask material layer, a first optical coating stack, and a first patterned photoresist including an array of hole shaped patterns formed therein, that can be used in accordance with an embodiment of the present application.

Figure 2:
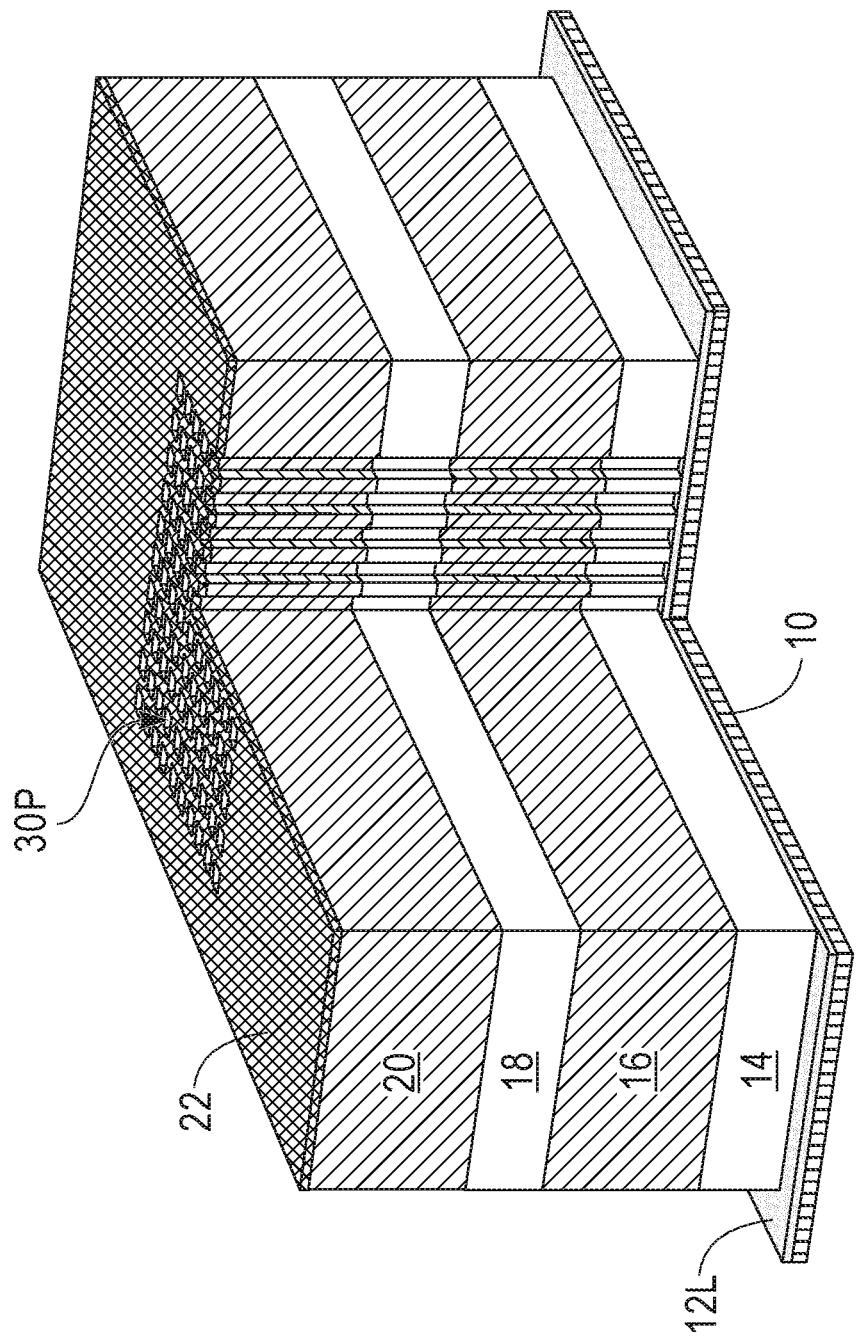

FIG. 2 is a 3D representation of the multilayered material stack of FIG. 1 after transferring the pattern of the first patterned photoresist including the array of hole shaped patterns into the underlying first optical coating stack, the hard mask material layer and each inorganic dielectric material layer and each spin-on carbon fill material layer, and thereafter removing the first patterned photoresist and first optical coating stack.

Figure 3:
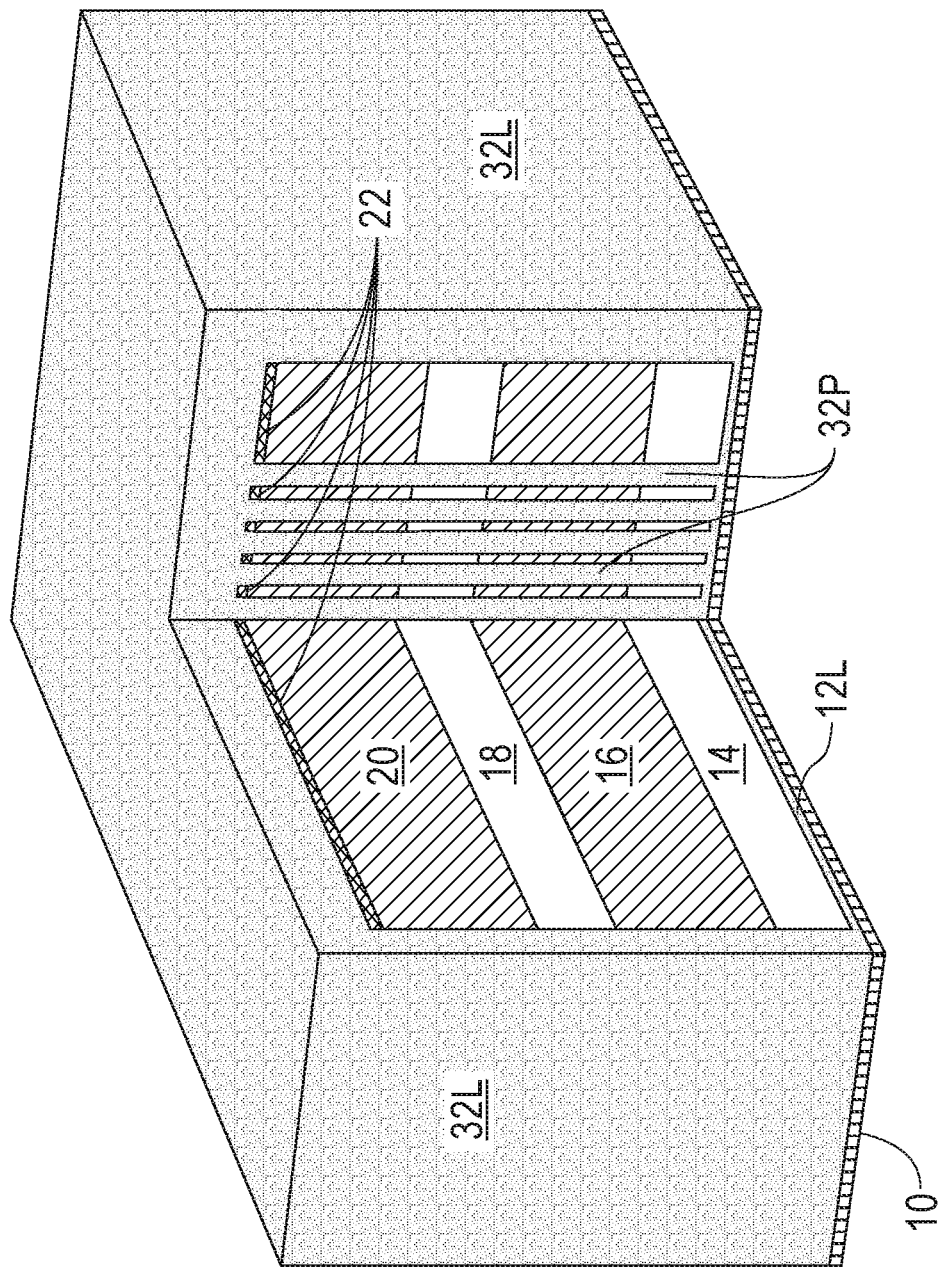

FIG. 3 is a 3D representation of the multilayered material stack of FIG. 2 after forming an oxide material layer surrounding the patterned multilayered material stack and within each hole shaped opening formed into the patterned multilayered material stack.

Figure 4:
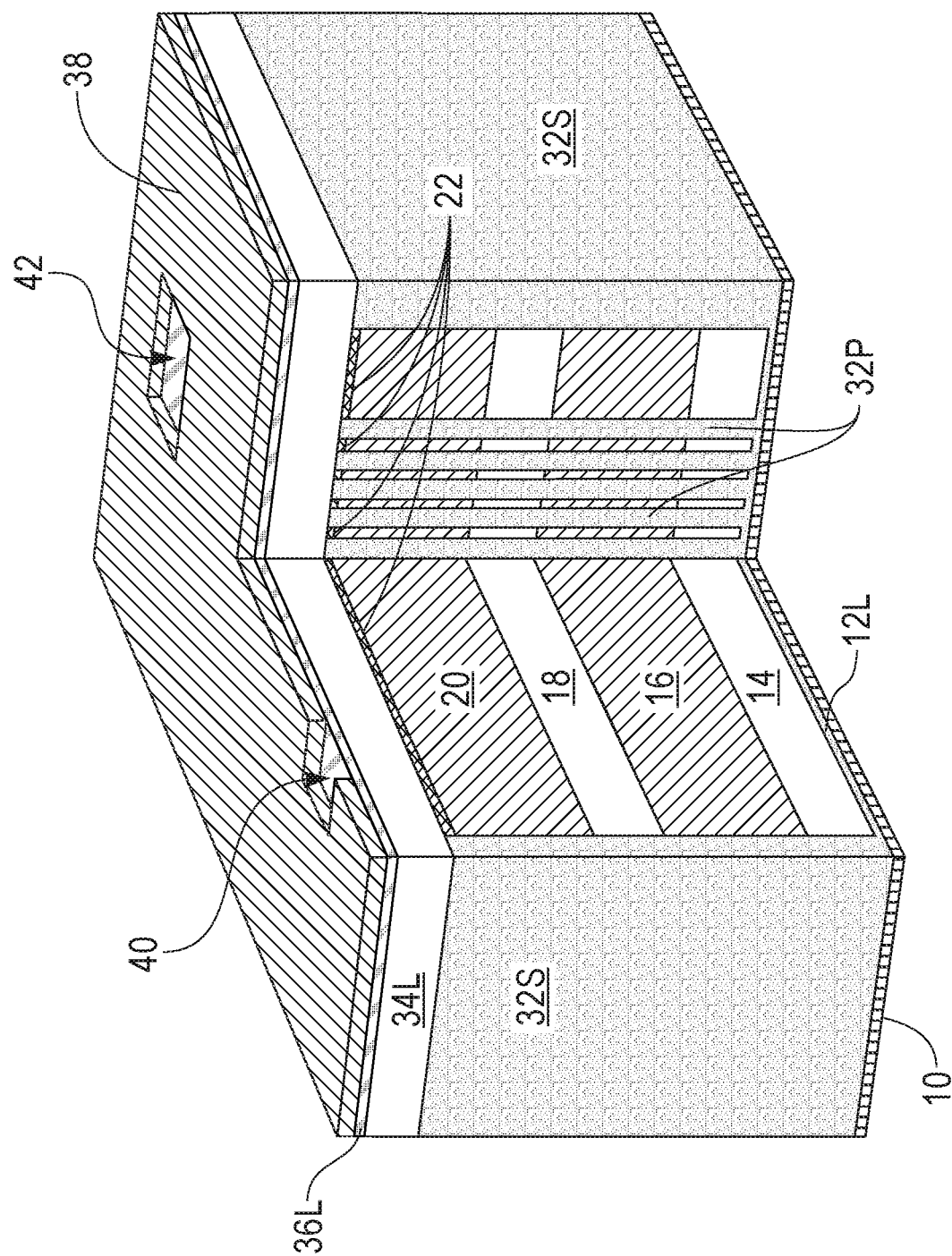

FIG. 4 is a 3D representation of the multilayered material stack of FIG. 3 after removing oxide material layer from atop the patterned multilayered material stack to physically expose the remaining portion of the hard mask material layer, and forming a second optical coating stack, and a second patterned photoresist including a first inlet/outlet opening and a second inlet/outlet opening formed therein.

Figure 5:
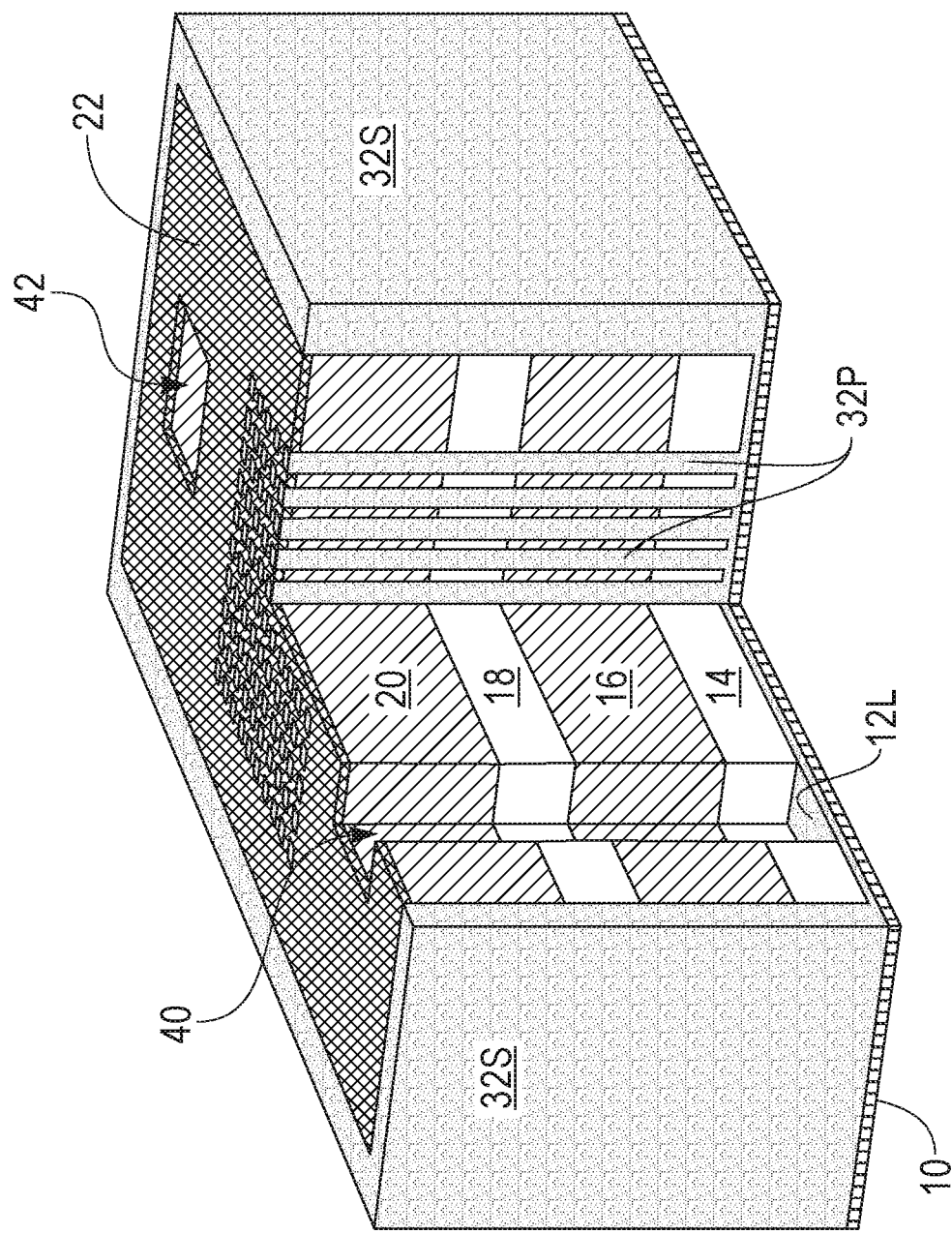

FIG. 5 is a 3D representation of the multilayered material stack of FIG. 4 after transferring the first and second inlet/outlet openings into the second optical coating stack, the remaining portion of the hard mask material layer and the remaining portion of each inorganic dielectric material layer and each spin-on carbon fill material layer, and thereafter removing the second optical coating stack and the second patterned photoresist.

Figure 6:
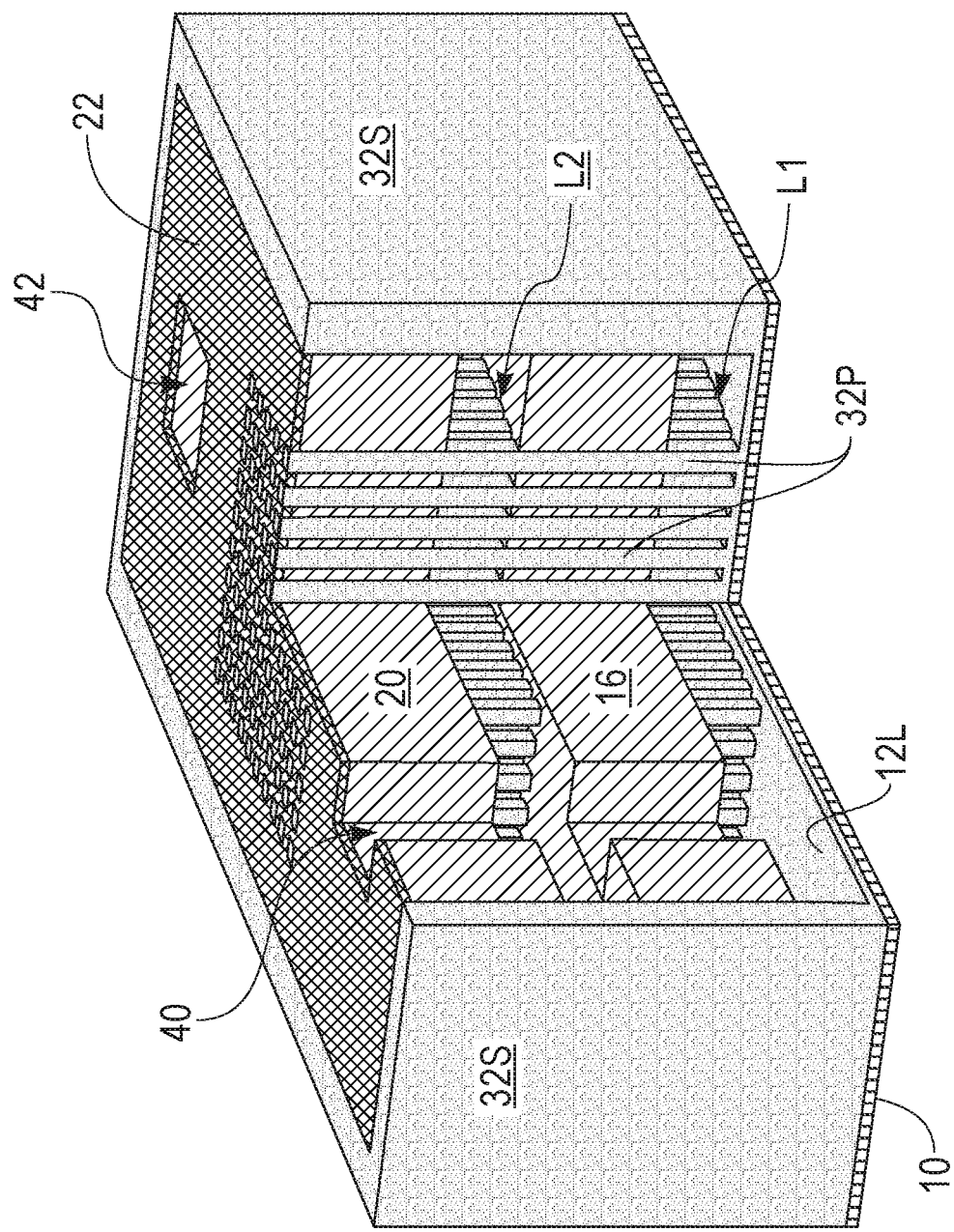

FIG. 6 is a 3D representation of the multilayered material stack of FIG. 5 after removing each spin-on carbon fill material layer to provide a microfluidic device including multilayer microfluidic channels in accordance with an embodiment of the present application.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. The drawings only show a region in which a multilayer microfluidic chip in accordance with the present application is formed. In some of the drawings, a portion of each structure is cut out for illustrative purposes only. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring to FIGS. 1-6, there is illustrated one embodiment of the present application which can be used in creating a multilayer microfluidic chip using spin-on carbon or other like sacrificial material. In this embodiment, two vertically stacked microfluidic channel layers (L1, L2) are described and illustrated. It is noted that although the description and drawings illustrate and describe the formation of two vertically stacked microfluidic channel layers (L1, L2), the present application is not limited to forming that number of vertically stacked microfluidic channel layers; in the present application two vertically stacked microfluidic channel layers (L1, L2) represents a minimum number of vertically stacked microfluidic channel layers that are present in the multilayer microfluidic chip. In the following embodiments, first and second inorganic dielectric material layers (16L, 20L) are described and illustrated as being used as a microfluidic channel separating material. Although the present application describes and illustrates using such inorganic dielectric materials as the microfluidic channel separating material, the present application can work when the first and second inorganic dielectric materials are replaced with polycrystalline silicon or amorphous silicon.

Referring now to FIG. 1, there is illustrated a multilayered material stack that can be initially used in creating the multilayer microfluidic chip of the present application. As is shown in FIG. 1, the material stack includes a substrate 10, a pad dielectric material layer 12L, a first spin-on carbon fill material layer 14L, a first inorganic dielectric material layer 16L, a second spin-on carbon fill material layer 18L, a second inorganic dielectric material layer 20L, a hard mask material layer 22L, a first optical coating stack (24L, 26L), and a first patterned photoresist 28 including an array of hole shaped patterns 30. In some embodiments, and above the second inorganic dielectric material layer 20L, additional alternating layers of spin-on carbon and an inorganic dielectric material can be formed to provide additional layers to the structure.

In one embodiment of the present application, the substrate 10 that can be used in the present application may include a glass substrate. In another embodiment of the present application, the substrate 10 may include a semiconductor material. The term "semiconductor material" denotes a material that has semiconducting properties. Examples of semiconductor materials that can be used as substrate include, but are not limited to, silicon (Si), a silicon germanium (SiGe) alloy, a silicon germanium carbide (Si-GeC) alloy, germanium (Ge), a III/V compound semiconductor or a II/VI compound semiconductor. In one example, silicon is used as the substrate 10.

In embodiments in which a semiconductor material is employed as the substrate 10, the substrate 10 may be a bulk semiconductor substrate or a semiconductor-on-insulator (SOI) substrate. By "bulk semiconductor substrate", it is meant a substrate that is entirely composed of at least one semiconductor material, as defined above. An SOI substrate includes a handle wafer, an insulator layer and a topmost semiconductor material layer. When an SOI substrate is employed as substrate 10, the topmost semiconductor material layer provides a surface in which the multilayer microfluidic chip of the present application is formed.

Pad dielectric material layer 12L is formed on a topmost surface of the substrate 10. The pad dielectric material layer 12L is a contiguous layer that can be composed of an oxide, a nitride or an oxynitride. In one example, the pad dielectric material layer 12L is composed of silicon dioxide. In some embodiments, the pad dielectric material layer 12L can be formed utilizing a deposition process such as, for example, chemical vapor deposition (CVD), plasma enhanced chemical vapor deposition (PECVD), atomic layer deposition (ALD) or physical vapor deposition (PVD). In other embodiments, the pad dielectric material layer 12L can be formed utilizing a thermal growth process such as, for example, thermal oxidation or thermal nitridation. The pad dielectric material layer 12L can have a thickness from 20 nm to 150 nm. Other thicknesses that are lesser than 20 nm, or greater than 150 nm may also be employed in the present application for the thickness of the pad dielectric material layer 12L.

The first spin-on carbon fill material layer 14L is formed on the topmost surface of the pad dielectric material layer 12L. The first spin-on carbon fill material layer 14L can be formed utilizing CVD, PVD, PECVD, spin-coating or evaporation. Although the present application describes and illustrates the use of spin-on carbon as a fill material, other sacrificial materials besides spin-on carbon such as, amorphous carbon, may be used provided that the other sacrificial materials may be employed as a gap fill material and that they can be easily and selectively removed from the final structure. The first spin-on carbon fill material layer 14L can have a thickness from 50 nm to 150 nm. Other thicknesses that are lesser than 50 nm, or greater than 150 nm may also be employed in the present application for the thickness of the first spin-on carbon fill material layer 14L.

First inorganic dielectric material layer 16L is formed on a topmost surface of the first spin-on carbon fill material layer 14L. The first inorganic dielectric material layer 16L is a contiguous layer that is compositionally different from the first spin-on carbon fill material layer 14L. In one embodiment of the present application, the first inorganic dielectric material layer 16L is composed of silicon nitride. Other examples of inorganic materials that may be employed as the first inorganic dielectric material layer 16L include, but are not limited to, silicon dioxide. The first inorganic dielectric material layer 16L can be formed utilizing a deposition process such as, for example, CVD, PECVD, ALD or PVD. The first inorganic dielectric material layer 16L typically has a thickness from 100 nm to 1000 nm; although other thicknesses are contemplated. In some embodiments, polycrystalline silicon or amorphous silicon can be used in place of the first inorganic dielectric material layer 16L.

Second spin-on carbon fill material layer 18L is formed on the topmost surface of the first inorganic dielectric material layer 16L. The second spin-on carbon fill material layer 16L can be formed utilizing CVD, PVD, PECVD, spin-coating or evaporation. Although the present application describes and illustrates the use of a spin-on carbon material, other sacrificial materials besides spin-on carbon may be used provided that the other sacrificial materials may be easily and selectively removed from the final structure. The second spin-on carbon fill material layer 18L may have a thickness within the range mentioned above for the first spin-on carbon fill material layer 14L.

Second inorganic dielectric material layer 20L is formed on a topmost surface of the second spin-on carbon fill material layer 18L. The second inorganic dielectric material layer 20L is a contiguous layer and may include one of the materials mentioned above for the first inorganic dielectric material layer 16L. In one embodiment, the second inorganic dielectric material layer 20L and the first inorganic dielectric material layer 16L are composed of a same inorganic dielectric material, e.g., silicon nitride. In another embodiment, the second inorganic dielectric material layer 20L is composed of an inorganic dielectric material that is compositionally different from the first inorganic dielectric material layer 16L. The second inorganic dielectric material layer 20L can be formed utilizing a deposition process such as, for example, CVD, PECVD, ALD or PVD. The second inorganic dielectric material layer 20L may have a thickness within the thickness range mentioned above for the first inorganic dielectric material layer 16L. In some embodiments, polycrystalline silicon or amorphous silicon can be used in place of the second inorganic dielectric material layer 20L.

As mentioned above, additional alternating layers of spin-on carbon (or another like sacrificial fill material) and an inorganic dielectric material (or polycrystalline silicon or amorphous silicon) or other like microfluidic channel separating material may be formed as desired.

Hard mask material layer 22L is formed on a topmost surface of the uppermost inorganic dielectric material; in the illustrated embodiment, the hard mask material layer 22L is located on a topmost surface of the second inorganic dielectric material layer 20L. The hard mask material layer 22L is a contiguous layer that is composed of a hard mask material that is compositionally different from the uppermost inorganic dielectric material layer. Examples of hard mask materials that can be employed as the hard mask material layer 22L include, but are not limited to, amorphous silicon, silicon dioxide, hafnium oxide, aluminum oxide, titanium oxide or titanium nitride. The hard mask material layer 22L can be formed utilizing a deposition process such as, for example, CVD, PECVD, ALD or PVD. The hard mask material layer 22L typically has a thickness from 20 nm to 150 nm; although other thicknesses are contemplated.

First optical coating stack (24L, 26L) is formed on a topmost surface of the hard mask material layer 22L. The first optical coating stack is typically composed of an organic planarization layer (OPL) 24L and an anti-reflective coating (ARC) layer 26L. In some embodiments, the first optical coating (24L, 26L) is entirely omitted. In other embodiments, at least one of the OPL 24L or the ARC layer 26L can be omitted.

The OPL 24L may include a material(s) such as spin-on carbon (SOC), diamond-like carbon, polyarylene ether, polyimide, polymethyl methacrylate, polymethylisopropenyl ketone, or photoresists. The OPL 24L can be formed utilizing a deposition process including, for example, CVD, PVD, PECVD, evaporation, spin coating, or dip coating. The OPL 24L may have a thickness from 50 nm and 200 nm, although lesser and greater thicknesses can also be employed as the thickness of the OPL 24L.

The ARC layer 26L may include an organic-ARC, a silicon-ARC, and/or a titanium-ARC. The ARC layer 26L can be formed by a deposition process including, for example, CVD, PVD, PECVD, evaporation, spin coating, or dip coating. The ARC layer 26L may have a thickness from 20 nm and 50 nm, although lesser and greater thicknesses can also be employed as the thickness of the ARC layer 26L.

First patterned photoresist 28 including an array of inversed-pillar shaped, i.e., hole shaped, patterns 30 is formed upon the first optical coating stack (24L, 26L). If the first optical coating stack (24L, 26L) is omitted, the first patterned photoresist 28 including the array of hole shaped patterns 30 can be formed upon the hard mask material layer 22L. The first patterned photoresist 28 including the array of hole shaped patterns 30 may be formed by applying a photoresist to the material layers that are to be patterned and then lithographically patterning the photoresist. Lithographic patterning includes resist exposure and development. It is noted that the array of hole shaped patterns 30 will be used to define an array of pillars within the structure of the present application. The array of hole shaped patterns 30 includes a plurality of hole shaped patterns that are spaced apart from each. Each hole shaped pattern 30 is identical and may have any shape including, but not limited to, cylindrical, square, or rectangular. The distance between each hole shaped pattern 30 may be from 25 nm to 250 nm.

Referring now to FIG. 2, there is illustrated the multilayered material stack of FIG. 1 after transferring the pattern of the first patterned photoresist 28 including the array of hole shaped patterns 30 into the underlying first optical coating stack (24L, 26L), the hard mask material layer 22L, and into each inorganic dielectric material layer (16L, 20L) and each spin-on carbon fill material layer (14L, 18L), and thereafter removing the first patterned photoresist 28 and first optical coating stack (24L, 26L).

The transferring of the pattern of the first patterned photoresist 28 including the array of hole shaped patterns 30 into the underlying first optical coating stack (24L, 26L), the hard mask material layer 22L, and into each inorganic dielectric material layer (16L, 20L) and each spin-on carbon fill material layer (14L, 18L), may include one or more anisotropic etching steps. In one example, one or more reactive ion etching processes are used to perform this transfer. The etching stops on a topmost surface of the pad dielectric material layer 12L.

The removal of the first patterned photoresist 28 including the array of hole shaped patterns 30 as well as first optical coating stack (24L, 26L) may occur automatically during the etching of the hard mask material layer 22L, each inorganic dielectric material layer (16L, 20L) and each spin-on carbon fill material layer (14L, 18L). In some embodiments, and if needed, an additional removal process may be performed utilizing one or more material removal processes including, for example, stripping or ashing; the material removal process stops on a topmost surface of a remaining portion of the hard mask material layer 22L.

After this first pattern transfer process, an array of hole shaped openings 30P are formed into the hard mask material layer 22L, each inorganic dielectric material layer (16L, 20L) and each spin-on carbon fill material layer (14L, 18L). A portion of the hard mask material layer 22L, each inorganic dielectric material layer (16L, 20L) and each spin-on carbon fill material layer (14L, 18L) remains after this first pattern transfer step. The remaining portion of the hard mask material layer 22L may be referred to herein as a hard mask material layer portion 22, the remaining portion of the second inorganic dielectric material layer 20L may be referred to herein as a second inorganic dielectric material layer portion 20, the remaining portion of the second spin-on carbon fill material layer 18L is referred to as a second spin-on carbon fill material layer portion 18, the remaining portion of the first inorganic dielectric material layer 16L may be referred to herein as a second inorganic dielectric material layer portion 16, and the remaining portion of the first spin-on carbon fill material layer 14L is referred to as a first spin-on carbon fill material layer portion 14.

Referring now to FIG. 3, there is illustrated the multilayered material stack of FIG. 2 after forming an oxide material layer 32L surrounding the patterned multilayered material stack (14/16/18/20/22) and within each hole shaped opening 30P formed into the patterned multilayered material stack (14/16/18/20/22). The oxide layer 32L has a surface that contacts a surface of the pad dielectric material layer 12L. The oxide layer 32L that is located on the sidewalls of the pattered multilayered material stack (14/16/18/20/22) defines a casing of the microfluidic chip of the present application.

In some embodiments, the oxide layer 32L can be formed by CVD, PECVD, ALD or a spin-on process. In cases in which the hole shaped openings 30P have a small critical dimension, ALD may be used to fill each of the hole shaped opening 30P with oxide material, and then spin-on coating, CVD or PECVD can be used to fill in the open areas. In some embodiments, a planarization process may follow the formation of the oxide layer 32L. In one example, the oxide layer 32L is composed of spin-on glass. In other examples, the oxide layer 32L may be composed of CVD-based flowable oxide.

Referring now to FIG. 4, there is illustrated the multilayered material stack of FIG. 3 after removing oxide material layer 32L from atop the patterned multilayered material stack (14/16/18/20/22) to physically expose the remaining portion of the hard mask material layer (i.e., the hard mask material layer portion 22), and forming a second optical coating stack (34L, 36L), and a second patterned photoresist 38 including a first inlet/outlet opening 40 and a second inlet/outlet opening 42 formed therein.

The removal of the oxide material layer 32L from atop the patterned multilayered material stack (14/16/18/20/22) to physically expose the remaining portion of the hard mask material layer (i.e., the hard mask material layer portion 22) may include a planarization process such as, for example, chemical mechanical planarization and/or grinding. An oxide material wall structure 32S remains laterally surrounding the patterned multilayered material stack (14/16/18/20/22) and oxide pillars 32P are formed. The oxide pillars 32P have the shape and dimensions of the hole shaped patterns mentioned above.

The second optical coating stack (34L, 36L) may include a second OPL 34L and a second ARC 36L. At least one of the OPL 34L and ARC 36L of the second optical coating stack (34L, 36L) can be omitted in some applications.

The second OPL 34L may include one of the materials mentioned above for the first OPL 24L, it may be formed utilizing one of the deposition processes mentioned above for forming the first OPL 24L, and it may have a thickness within the thickness range mentioned above for the first OPL 24L.

The second ARC 36L may include one of the materials mentioned above for the first ARC layer 26L, it may be formed utilizing one of the deposition processes mentioned above for forming the first ARC layer 26L, and it may have a thickness within the thickness range mentioned above for the first ARC layer 26L.

The second patterned photoresist 38 including the first inlet/outlet opening 40 and the second inlet/outlet opening 42 may be formed by depositing a photoresist material, and lithographically patterning the photoresist material to include the first and second inlet/outlet openings (40, 42).

Referring now to FIG. 5, there is illustrated the multilayered material stack of FIG. 4 after transferring the first and second inlet/outlet openings (40, 42) into the second optical coating stack (34L, 36L), the remaining portion of the hard mask material layer (i.e., hard mask material layer portion 22) and the remaining portion of each inorganic dielectric material layer (e.g., the first and second inorganic dielectric material layer portions (16 and 20)) and each spin-on carbon fill material layer (e.g., the first and second spin-on carbon fill material layer portions (14 and 18)), and thereafter removing the second optical coating stack (34L, 36L) and the second patterned photoresist 38.

The transferring of the first and second inlet/outlet openings (40, 42) into the second optical coating stack (34L, 36L), the remaining portion of the hard mask material layer (i.e., hard mask material layer portion 22) and the remaining portion of each inorganic dielectric material layer (e.g., the first and second inorganic dielectric material layer portions (16 and 20)) and each spin-on carbon fill material layer (e.g., the first and second spin-on carbon fill material layer portions (14 and 18)) may be performed utilizing one or more anisotropic etching processes. The etch stops on a topmost surface of the pad dielectric material layer 12L. In one example, this second transferring step includes one or more reactive ion etching processes. After this second transferring step, first and second inlet-outlet openings (40 and 42) are present in patterned multilayered material stack (14/16/18/20/22).

The removal of the second patterned photoresist 38 and the second optical coating stack (34L, 36L) can be performed utilizing any material removal process including stripping or ashing.

Referring now to FIG. 6, there is illustrated the multilayered material stack of FIG. 5 after removing each spin-on carbon fill material layer portion (14 and 18) to provide a microfluidic device including multilayer microfluidic channels (L1, L2) in accordance with an embodiment of the present application.

Each spin-on carbon fill material layer portion (14 and 18) can be removed utilizing one or more material removal processes that are selective in removing spin-on carbon (or any other sacrificial material that is used in lieu of spin-on carbon). In one embodiment, an oxygen plasma may be used to remove all the spin-on carbon from the structure. In another embodiment, a wet etch such as, a sulfuric acid/hydrogen peroxide mixture (SPM or Piranha solution) can be used to remove all the spin-on carbon from the structure.

Notably, FIG. 6 illustrates an exemplary microfluidic chip of the present application that contains multilayer microfluidic channels, L1 and L2, stacked one atop the other. The exemplary microfluidic chip also includes fluid input/output ports (i.e., the first and second inlet/outlet openings (40 and 42)). The multilayer microfluidic channels, L1 and L2, are in fluid communication with each other since the input/output ports extend from a top portion of the chip to a bottom portion of the chip. The multilayer microfluidic channels, L1 and L2, contain an array of oxide pillars 32P that are spaced apart from each other. The multilayer microfluidic channels, L1 and L2, are also spaced apart from each other by an inorganic dielectric material (or polycrystalline or amorphous silicon). In the illustrated embodiment, the oxide pillars extend upward from the pad dielectric material layer 12L through each inorganic dielectric material layer portion (or polycrystalline or amorphous silicon) and through the hard mask material layer portion 22.

Since no bonding is used to create the microfluidic chip of the present application, the cost and yield problems associated with bonding is circumvented. The exemplary microfluidic chip of the present application that contains multilayer microfluidic channels stacked one atop the other as is shown in FIG. 6 also has a high volumetric flow rate, and can be used in a wide variety of applications including, for example, lab-on chip.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a microfluidic chip, the method comprising:
   forming a multilayered material stack comprising alternating layers of a sacrificial material and a microfluidic channel separating material;
   creating, by a first lithography and etching step, an array of hole shaped openings in the multilayered material stack;
   filling each hole shaped opening with an oxide material to provide an array of oxide pillars;
   defining, by a second lithographic and etching step, inlet/outlet openings in the multilayered material stack; and
   removing each layer of the sacrificial material to provide a microfluidic channel layer containing spaced apart oxide pillars located beneath each layer of microfluidic channel separating material.

2. The method of claim 1, wherein the sacrificial material is composed of spin-on carbon or amorphous carbon.

3. The method of claim 1, wherein the microfluidic channel separating material is composed of an inorganic dielectric material, polycrystalline silicon or amorphous silicon.

4. The method of claim 1, wherein a height of each spaced apart oxide pillar present in the microfluidic channel layer is adjusted by the thickness of each layer of microfluidic channel separating material.

5. The method of claim 1, wherein the multilayered material stack further comprises a substrate and a pad dielectric material layer located beneath a bottommost layer of sacrificial material, wherein the pad dielectric material layer forms an interface with the bottommost layer of sacrificial material.

6. The method of claim 5, wherein the substrate comprises glass or a semiconductor material.

7. The method of claim 5, wherein the multilayered material stack further comprises a hard mask material layer forming an interface with a topmost layer of microfluidic channel separating material.

8. The method of claim 7, further comprising a patterned photoresist containing an array of inverse-shaped pillar patterns located above the hard mask material layer, wherein the patterned photoresist is used in the creating of the array of hole shaped patterns and the patterned photoresist containing the array of inverse-shaped pillar patterns is removed prior to the filling of each hole shaped opening with an oxide material.

9. The method of claim 8, further comprising an optical coating stack located between the hard mask material layer and the patterned photoresist, wherein the optical coating stack includes an organic planarization layer and an anti-reflective coating.

10. The method of claim 1, wherein the oxide material comprises spin-on glass or a flowable oxide.

11. The method of claim 1, wherein during the forming of the oxide material, an oxide material wall structure is formed surrounding the multilayered material stack.

12. The method of claim 1, wherein the removing of the sacrificial material is performed utilizing one or more material removal processes.

13. The method of claim 1, wherein the sacrificial material is composed of spin-on carbon, and the removing of the sacrificial material includes utilizing an oxygen plasma.

14. The method of claim 1, wherein the sacrificial material is composed of spin-on carbon, and the removing of the sacrificial material includes utilizing a sulfuric acid/hydrogen peroxide mixture.

15. A method of forming a microfluidic chip, the method comprising:
   forming a multilayered material stack comprising alternating layers of a spin-on carbon and an inorganic dielectric material;

creating, by a first lithography and etching step, an array of hole shaped openings in the multilayered material stack;

filling each hole shaped opening with an oxide material to provide an array of oxide pillars;

defining, by a second lithographic and etching step, inlet/outlet openings in the multilayered material stack; and removing each layer of the spin-on carbon to provide a microfluidic channel layer containing spaced apart oxide pillars located beneath each layer of inorganic dielectric material.

16. A microfluidic chip comprising:

at least two vertically stacked microfluidic channel layers, wherein a layer of microfluidic channel separating material is located between each vertically stacked microfluidic channel layer;

an array of pillars present in each vertically stacked microfluidic channel layer and passing through each layer of the microfluidic channel separating material, wherein each pillar of the array of pillars is composed of an oxide material;

and an inlet/outlet opening extending through the microfluidic chip and interconnecting each microfluidic channel layer.

17. The microfluidic chip of claim 16, wherein the microfluidic channel separating material is composed of an inorganic dielectric material, polycrystalline silicon or amorphous silicon.

18. The microfluidic chip of claim 16, further comprising a wall structure laterally surrounding the least two vertically stacked microfluidic channel layers and each microfluidic channel layer, wherein each pillar of the array of pillars and the wall structure are composed of a same oxide material.

19. The microfluidic chip of claim 16, further comprising a substrate and a pad dielectric material layer located beneath a bottommost microfluidic channel layer of the vertically stacked microfluidic channel layers, wherein each pillar of the array of pillars contacts a topmost surface of the pad dielectric material layer.

* * * * *